May 12, 1959 V. R. DE LONG 2,886,752
SERVOSYSTEM ADAPTED FOR AUTOMATIC ADJUSTMENT OF RADIO TRANSMITTERS
Filed Jan. 31, 1957
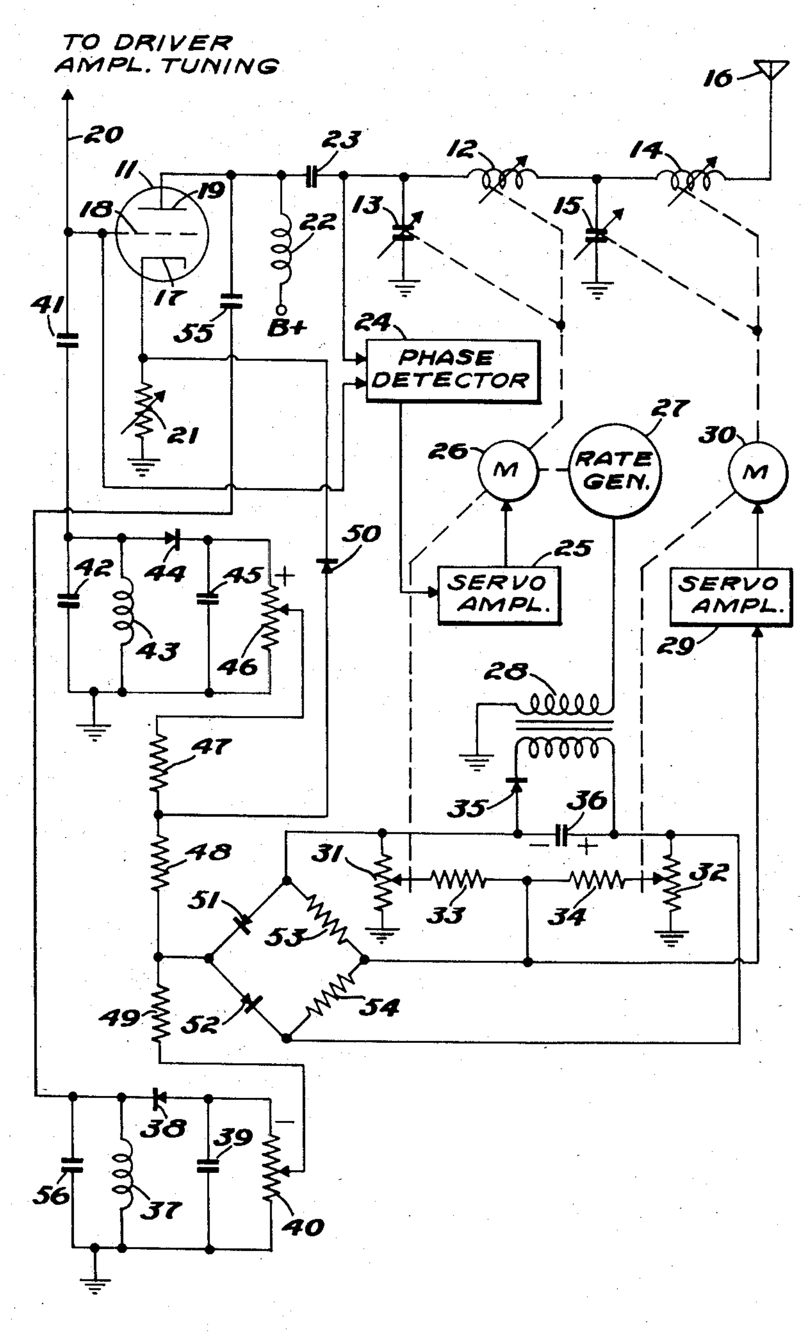
INVENTOR.
VINCENT R. DELONG
BY Marvin Moody
ATTORNEY United States Patent Office 2,886,752
Patented May 12, 1959

2,886,752

SERVOSYSTEM ADAPTED FOR AUTOMATIC ADJUSTMENT OF RADIO TRANSMITTERS

Vincent R. De Long, Cedar Rapids, Iowa, assignor to Collins Radio Company, Cedar Rapids, Iowa, a corporation of Iowa Application January 31, 1957, Serial No. 637,567

11 Claims. (Cl. 318—28)

This invention pertains to radio transmitter power amplifier stages and more particularly to control circuits in servo systems for automatically adjusting the loading of the stages.

An example of the application of servo systems to automatic loading is described in United States Patent No. 2,376,667, issued to O. B. Cunningham et al., on May 22, 1945. It is well known that the exciter portion of a radio transmitter may be readily tuned by a single control which may be operated either automatically or manually. The various tuning elements of an exciter may be coupled mechanically to a single shaft and a particular position of the shaft will correspond repeatedly to a particular frequency to which the transmitting circuits are to be tuned. However, since variations in reactive and loading characteristics of an antenna are a function of frequency, individual control of reactive elements is required for tuning the plate circuit of the final stage and for coupling the antenna. Tuning and loading the final stage is complicated further in that different antennas may be used under different conditions or that a particular antenna may have varying characteristics because of changes in position.

In order to provide required flexibility in tuning and loading of the final stage, a transmitter may include a servo system that is responsive to phase changes for tuning the plate circuit and a servo system that is responsive to plate current changes for varying the coupling between the antenna and the plate circuit. These systems operate satisfactorily when the power amplifier stage is operated consistently in a particular type of service; for example, class "C" service in which the plate current flows for less than one-half of each cycle of the impressed alternating current signal. However, a combination of voltage control and current control is required for the loading servo when the final stage is to be operated over a wide range of plate current conditions.

An object of the present invention is to supply improved control circuits which apply required control voltages to loading servo systems for maintaining constant the output impedance of transmitters for different classes of service.

A further object is to provide, in combination with loading control circuits, lock-out circuits which effectively disconnect loading control circuits during tuning of the final stages.

And still another object is to provide coarse-tuning control circuits that adjust output coupling circuits in response to tuning of the final stages.

The following description and appended claims may be more readily understood with reference to the single drawing which shows in a circuit schematic diagram a final power amplifier stage utilizing the servo loading control circuits of this invention.

A power amplifier stage utilizing the control circuits of this invention includes an electron control device, first adjustable reactive elements for tuning the output circuit to resonance, and second adjustable reactive elements for coupling the load to the output circuit of the stage. Although the function of one set of reactive elements is namely for tuning and the function of the other set of reactive elements is namely for loading, it is to be understood that the elements react mutually and that when the value of either one is changed to obtain a desired change in its respective function, the other function is changed a lesser amount.

In the instant example, the automatically tuned amplifier stage includes triode electron tube 11 having a plate circuit which includes elements 12 and 13 for tuning the circuit and elements 14 and 15 for coupling antenna 16 to the plate circuit. Electron tube 11 may be a usual triode which includes cathode 17, control grid 18, and anode or plate 19. Input lead 20 of the stage is connected between control grid 18 and driver amplifier tuning circuits of a preceding exciter. The cathode 17 is connected through variable cathode resistor 21 to ground. Plate 19 is connected through radio-frequency choke 22 to a source of B-plus voltage and also through blocking capacitor 23 to the plate tuning circuit. The plate tuning circuit that includes variable capacitor 13 and variable inductor 12 is a reactive L-type network and is connected to another reactive L-type network that includes variable capacitor 15 and variable inductor 14 for coupling antenna 16 to the plate circuits.

A servo system for simultaneously adjusting tuning capacitor 13 and variable inductor 12 includes serially connected phase detector 24, servo amplifier 25, and servo motor 26. Servo motor 26 is mechanically coupled to inductor 12, capacitor 13, rate generator 27, and to a coarse-tuning control potentiometer 31. Phase detector 24 has one input circuit connected to the input or grid circuit of tube 11 and has another input circuit connected to the output circuit of the tube. In response to departure in phase in the grid and plate circuits from 180°, phase detector 24 develops a control voltage for application to servo amplifier 25. Servo motor 26 operates to adjust plate tuning elements 12 and 13 to restore phase difference of 180°. Rate generator 27 is operated by servo motor 26 to apply voltage through transformer 28 to a coarse-tuning bridge circuit and to a fine-tuning lock-out control circuit.

The servo system, which varies the coupling between the antenna and the plate circuits to control loading of the transmitter, includes servo amplifier 29 and servo motor 30. Servo amplifier 29 is connected to motor 30 to control its operation and motor 30 is connected to variable capacitor 15, variable inductor 14, and coarse-tuning potentiometer 32.

The control circuits for servo amplifier 29 include a fine-loading control circuit, a coarse-loading control circuit, and an electrical lock-out circuit which disconnects the fine-loading control circuit from servo amplifier 29 while the coarse-loading control circuit is functioning. The coarse-loading control circuit includes coarse-tuning potentiometers 31 and 32 that are connected in a bridge circuit arrangement with resistors 33 and 34. During plate tuning, alternating-current voltage is applied from rate generator 27 to the primary winding of transformer 28. The secondary circuit of transformer 28 includes diode rectifier 35 connected in series with filter capacitor 36. A diagonal of the coarse-loading control bridge that includes potentiometers 31 and 32 is connected across filter capacitor 36 so that direct-current voltage is applied across the potentiometers. The junction of resistors 33 and 34 that are connected in series between the arms of potentiometers 31 and 32 is connected to the input circuit of servo amplifier 29.

The fine-loading control circuit is connected for comparing voltages at three points in the amplifier stage. In general, the control circuit includes two rectifying and smoothing circuits connected respectively to the grid and plate circuits of the power amplifier stage and a combination rectifying and switching circuit connected to the cathode circuit. The output circuits of the three rectifying or voltage-sensing circuits are connected to a voltage divider wherein the output voltages from the sensing circuits are combined to develop a control voltage of required magnitude and polarity for application to the input circuit of servo amplifier 29.

The voltage-sensing circuit connected to plate 19 of tube 11 includes capacitors 55 and 56 that are connected in series between the plate and ground. A conventional rectifier circuit is connected across capacitor 56. This circuit includes radio-frequency choke 37, diode rectifier 38, filter capacitor 39, and potentiometer or load resistor 40. The arm of potentiometer 40 is connected to one end of the voltage divider which supplies voltage to the input of servo amplifier 29. The polarity of diode 38 is such that current flows in that direction required to develop with respect to ground a negative voltage across potentiometer 40.

The voltage-sensing circuit that is connected to grid 18 of tube 11 includes capacitors 41 and 42 connected in series between the grid and ground. A rectifier circuit similar to that for the plate voltage-sensing circuit is connected across capacitor 42. This circuit includes radio-frequency choke 43, rectifier 44, filter capacitor 45, and potentiometer 46. The polarity of diode 44 is such that voltage developed with respect to ground across the potentiometer 46 is positive. The arm of potentiometer 46 is connected to the voltage divider for comparing the positive voltage developed across potentiometer 46 with the negative voltage developed across potentiometer 40.

The voltage divider includes resistors 47, 48, and 49 connected in series between the arms of potentiometers 40 and 46. Voltage for servo amplifier 29 is obtained from the junction of resistors 48 and 49 which is connected to the servo amplifier through a lock-out circuit. The values of the resistors of the voltage divider and the settings of the arms of potentiometers 40 and 46 are such that the control voltage at the junction of resistors 48 and 49 becomes zero for a predetermined ratio of voltage on plate 19 to voltage on grid 18.

A third voltage-sensing circuit becomes effective when the grid drive exceeds the maximum value that allows linear operation of the power amplifier stage. This voltage-sensing circuit, which may be termed a clamping circuit, includes diode rectifier 50 which is connected between cathode 17 of tube 11 and the junction of resistors 47 and 48 of the voltage divider. Diode 50 is connected such that it becomes conductive when the positive voltage at the junction of resistors 47 and 48 with respect to ground becomes greater than the voltage developed across cathode resistor 21.

The lock-out circuit is a bridge circuit that includes diode rectifiers 51 and 52 and resistors 53 and 54. The junction of resistors 48 and 49 of the voltage divider is connected to one diagonal of the bridge at the junction of diodes 51 and 52 so that when the diodes are nonconductive, the load-sensing circuits are efficiently disconnected from the input of servo amplifier 29. The other diagonal of the bridge is connected in parallel with the coarse-loading control circuit and capacitor 36 to which is applied direct-current voltage that is developed in response to the operation of rate generator 27. When the plate circuits of the power amplifier stage are being tuned and the rate generator is in operation, voltage of proper polarity is applied to the lock-out circuit to prevent conduction through diodes 51 and 52.

The control system of this invention may obviously be applied to power amplifier stages having different circuit arrangements for plate tuning and antenna loading. For example, rather than using a reactive L-network for coupling the antenna to the plate circuit, an R.-F. transformer for inductive coupling may be used, and coupling between its primary and secondary windings may be varied.

In the power amplifier stage, according to the accompanying schematic diagram, the plate circuit is automatically tuned and the coupling to the antenna is adjusted in response to change of frequency in the preceding exciter. When the plate circuit is resonant at a different frequency from that of the signal which is applied to the input circuit, the phase difference on the plate and grid departs from the usual 180° phase difference. In response to departure of phase from 180°, phase detector 24 develops a control voltage having a polarity dependent upon the direction of departure. This control voltage is applied to servo amplifier 25 for operating servo-motor 26 in a direction dependent upon the polarity of the control voltage. The servo-motor operates to adjust variable capacitor 13 and variable inductor 12 until the plate circuit is tuned to the frequency of the signal that is applied to the input circuit. When the plate circuit is properly tuned, signal voltage on the plate is 180° out of phase with the signal voltage applied to the control grid, and the control voltage at the output of phase detector 24 becomes zero to stop operation of servo motor 26.

A rate generator 27 is operated by servo-motor 26 during the plate tuning process to apply alternating-current voltage across the primary of transformer 28. The voltage induced into the secondary winding of transformer 28 is rectified by diode 35 for applying direct-current voltage across the coarse-loading control circuit that includes potentiometers 31 and 32 and across the lock-out circuit that includes diodes 51 and 52. The lock-out circuit is responsive to the application of voltage thereto for isolating the fine-loading control circuits from the input circuit of servo amplifier 29. When the coarse-loading control circuit is unbalanced, control voltage is applied from the junction of resistors 33 and 34 to the input of servo amplifier 29. Potentiometers 31 and 32 of the coarse-loading control circuit are operated simultaneously by plate tuning servo motor 26 and loading servo motor 30, respectively. Control voltage applied to servo amplifier 29 as a result of operation of potentiometer 31 causes motor 30 to operate potentiometer 32 in the required direction for maintaining the control voltage to servo amplifier 29 near zero. At the completion of the tuning cycle, variable capacitor 15 and variable inductor 14 have been approximately positioned by servo motor 30 for providing the proper degree of coupling between the antenna and the plate circuits. When servo motor 26 ceases operation in response to the plate circuit being tuned to the proper frequency, direct-current voltage supplied from rate generator 27 is removed from the coarse-loading control circuit and the lock-out circuit. Then the diodes 51 and 52 of the lock-out circuit connect the fine-loading control circuit to servo amplifier 29.

After the plate circuit has been tuned, the fine-loading control circuit applies control voltage to servo amplifier 29 to operate servo motor 30 for exactly positioning variable capacitor 15 and variable inductor 14. When the signal voltage applied to control grid 18 of tube 11 is within the range of voltage for linear operation of tube 11, diode 50 is non-conducting and the control voltage for application to servo amplifier 29 is the function of only the ratio of the voltage on plate 19 to the voltage on grid 18. Positive voltage on the arm of potentiometer 46 is developed by that rectifier which is connected through coupling capacitor 41 to control grid 18, and negative voltage on the arm of potentiometer 40 is developed by that rectifier which is connected through coupling capacitor 55 to plate 19. The resulting voltage obtained from the comparison of positive and negative voltages that are applied to the voltage divider from the arms of the potentiometers is present at the junction of resistors 48 and 49 that is connected to the input of the servo amplifier 29. When the amplifier stage is not properly loaded, a control voltage with polarity that is dependent upon the direction of departure from the ratio of the plate voltage to the control grid voltage, is applied to the servo amplifier. Servo motor 30 operates until variable inductor 14 and variable capacitor 15 are positioned to return the voltage ratio to a predetermined value and thereby to restore the control voltage to zero. Since adjustments of loading elements 14 and 15 and tuning elements 12 and 13 are not fully independent, the servo systems for tuning and for loading may operate alternately until the reactive elements are adjusted precisely for resonance and for desired loading.

Assume that diode 50 which is connected to cathode 17 is disconnected from the circuit and that input signal to grid 18 is gradually increased in amplitude from within that range for linear operation of the tube to a value for a non-linear or class "C" operation. The ratio of plate voltage to control grid voltage remains constant for signal changes while the tube is operating linearly, but for higher signal voltage, the ratio changes when increases in plate current are non-linear with increases of grid voltage. Since the plate current becomes limited for higher input signals, the negative voltage that is derived from the plate circuit and is applied to the voltage divider in the fine-loading control circuit does not increase as fast as the positive voltage that is derived from the grid circuit. The different rates of voltage change produce a control voltage having polarity for reducing the coupling between the antenna and the plate circuit. In practice, the control voltage to servo amplifier 29 should remain constant for signals of a particular frequency so that the output impedance remains the same regardless of the amplitude of the input signal.

To maintain output impedance constant for higher input voltages, the control voltage which is derived from comparing voltage on plate 19 with voltage on grid 18 is modified by connecting a tap of the voltage divider through diode 50 to cathode 17. While diode 50 is conductive, change in fine-loading control voltage due to change in voltage on the control grid is small because the positive end of the voltage divider is effectively clamped through diode 50 to cathode 17. The diode becomes conductive when the voltage at the junction of resistors 47 and 48 becomes greater than the voltage on cathode 17 and the diode thereby connects resistor 21 in parallel with that portion of the voltage divider that is connected through potentiometer 46 to ground. Resistance of the cathode circuit is substantially less than the resistance of resistor 47 and potentiometer 46. Therefore, when a strong input signal is applied to control grid 18, control voltage is derived namely from the ratio of the voltage on the plate to the voltage on the cathode.

Since the transition from the non-conductive to the conductive state of the diode is gradual, the transition from grid voltage to cathode voltage for developing a control voltage is also gradual to conform with the gradual change in the operating condition of the tube. Through proper selection of values in the voltage divider and cathode circuits, the control voltage at the junction of resistors 47 and 48 remains constant for signal of wide amplitude at a selected frequency. The negative voltage that is applied to the voltage divider for different operating conditions of the tube is proportional to the flow of signal current in the plate circuit; and obviously for strong input signal, the positive voltage that is applied to the divider is proportional to the plate current which flows through cathode resistor 21

The control circuits of this invention stabilize automatic loading servo systems for wide variations and amplitude of input signals. The control circuits have been applied to single side-band transmitting systems in which input signal to the power amplifier stage at times exceeds the maximum signal allowable for linear operation.

Although this invention has been described with respect to a particular embodiment thereof, it is to be understood that changes and modifications may be made therein which are within the full and intended scope of the invention as described in the appended claims.

What is claimed is:

1. In a power amplifier stage having an input circuit and an output circuit, a load sensing circuit having voltage comparator means and load current sensing means for controlling load impedance of said output circuit, said voltage comparator means being connected between said input circuit and said output circuit, servo means electrically connected to said voltage comparator means, said voltage comparator means responsive to a change in ratio of signal voltage on said output circuit to the signal voltage on said input circuit for applying direct control voltage to said servo means, variable reactance elements in said output circuit, said servo system operating in response to application of control voltage to adjust said variable reactance elements until a predetermined ratio is obtained between the voltage on said output circuit and voltage on said input circuit, said load current sensing means being electrically coupled to said output circuit and to said voltage comparator means, said load current sensing means responsive to signal voltage on said input circuit exceeding a predetermined value for changing said direct control voltage in proportion to change in current in said output circuit, said voltage comparator means and said load current sensing means cooperating to maintain adjustment of said reactance elements thereby to allow a greater ratio of voltage in said output circuit to voltage in said input circuit than said predetermined ratio that is obtainable by operation of only said voltage comparator means.

2. In a power amplifier stage including an electron vacuum tube having at least a cathode, a control grid, and a plate; an input grid circuit connected to said control grid, an output plate circuit connected to said plate, said plate circuit including reactance elements that are adjustable for determining the impedance thereof, a servo system operable for adjusting said reactance elements to obtain required impedance in said plate circuit at different frequencies, a load sensing circuit having in combination a voltage comparator circuit and a load current sensing circuit for controlling the operation of said servo system, said voltage comparator circuit connected to said grid and plate circuits and to said servo system, said voltage comparator circuit responsive to a change in ratio of voltage on said plate circuit to the voltage on said input circuit for applying direct control voltage to said servo system, said servo system operating in response to change of voltage from said voltage comparator circuit to adjust said variable reactance elements until a predetermined ratio is obtained between the voltage on said plate circuit and voltage on said grid circuit, said load current sensing circuit being electrically coupled to said plate circuit and to said voltage comparator circuit, said load current sensing circuit responsive to voltage on said grid circuit exceeding a predetermined value for applying voltage to said comparator circuit in proportion to current flow in said plate circuit, said voltage comparator circuit and said load current sensing circuit cooperating to maintain adjustment of said reactance elements thereby to allow a greater ratio of voltage in said plate circuit to voltage in said grid circuit than said predetermined ratio that is obtainable by operation of only said voltage comparator circuit.

3. In a power amplifier stage including an electron vacuum tube having at least a cathode, a control grid, and a plate; an input grid circuit connected to said control grid, an output plate circuit connected to said plate, said plate circuit including reactance elements that are adjustable for determining the impedance thereof, a servo system operable for adjusting said reactance elements to obtain required impedance in said plate circuit at different frequencies; the combination of a voltage comparator circuit and a load current sensing circuit for controlling the operation of said servo system, a voltage divider having end terminals and first and second intermediate taps, said voltage comparartor circuit including first and second rectifier circuits having individual input circuits connected to said grid circuit and to said plate circuit respectively and having output circuits connected individually to said end terminals of said voltage divider, said servo system having an input control circuit connected to said first intermediate tap, said load current sensing circuit including a resistor and a rectifier, a plate return circuit including said resistor and said cathode, said rectifier being connected between said resistor and said second intermediate tap, said rectifier conducting current in response to signal voltage on said grid circuit exceeding a predetermined value, said voltage comparator circuit and load current sensing circuit cooperating to develop control voltage for said control circuit, and said servo system operating in response to the application of said control voltage to maintain constant impedance in said output circuit for extreme values of plate current.

4. In a power amplifier stage having an input circuit and an output circuit, the combination of a voltage comparator circuit and an amplifier load current sensing circuit for controlling the load impedance of said output circuit, said voltage comparator circuit including first and second voltage sensing circuits, a resistive voltage divider having first and second intermediate taps, said first voltage sensing circuit being connected between said input circuit and one end of said resistive voltage divider for applying direct voltage of predetermined polarity to said divider, said second voltage sensing circuit being connected between said output circuit and the opposite end of said divider for applying direct voltage of opposite polarity from said predetermined polarity to said divider, a variable resonant element in said output circuit, servo means coupled to said first intermediate tap of said voltage divider, said servo means operating in response to variation from a predetermined ratio of signal voltage on said output circuit to signal voltage on said input circuit, said servo means operating to adjust said variable resonant element for obtaining said predetermined ratio, said load current sensing circuit being connected to said output circuit and to said second intermediate tap on said voltage divider, said load current sensing circuit responsive to grid voltage change to plate current change exceeding a predetermined value for changing the voltage on said first intermediate tap, and said combined control circuits effective in maintaining the load impedance of said output circuit substantially constant for wide variations in amplitude of signal on said input and output circuits.

5. In a power amplifier stage including an electron tube having at least a cathode, a control grid, and a plate; an input circuit connected to said control grid, an output circuit connected to said plate, the combination of a voltage comparator circuit and a load current sensing circuit for controlling the impedance of said output circuit, a servo system with a control circuit electrically connected to said comparator circuit, said comparator circuit being connected to said input and output circuits, said load current sensing circuit including an impedance element and a rectifier, said impedance element being connected to said cathode in the plate return circuit of said tube, said rectifier being connected between said impedance element and said comparator circuit, said rectifier being non-conducting in response to application of higher voltage from said impedance element than from said comparator circuit, reactance elements in said output circuit, said servo system operating to adjust said reactance elements thereby to change the ratio of voltage on said output circuit to the voltage on said input circuit, said voltage comparator circuit responding to change in ratio of voltage on said output circuit to voltage on said input circuit for providing a change in voltage in the control circuit of said servo system, said servo system operating in response to operation of only said comparator circuit to maintain said voltage ratio constant, said rectifier becoming conductive in response to the voltage to said rectifier from said comparator circuit becoming greater than the voltage from said impedance element when signal voltage on said input circuit is high, said load current sensing circuit responsive to change in plate current of said tube to change the voltage on said comparator circuit thereby to change voltage on said control circuit, and said servo system responding to the combined operation of said voltage comparator circuit and said load current sensing circuit to change said voltage ratio as required for maintaining the impedance of said reactive elements substantially constant for different operating conditions of said tube over wide variations in voltages on said input and output circuits.

6. In a power amplifier stage having an input circuit and an output circuit, first and second adjustable reactive elements in said output circuit, tuning means operable to adjust said first reactive element for tuning said output circuit to a desired frequency, servo means for tuning said second reactive element for determining the loading in said output circuit, load control circuits responsive to a change of loading in said output circuit for developing a control voltage, a lock-out circuit, said load control circuits being connected through said lock-out circuit to said servo means, said servo means responsive to application of control voltage from said load control circuits for maintaining impedance of said output circuit constant regardless of frequency and amplitude of signal in said output and said input circuits, a voltage generator coupled to said tuning means and connected to said lock-out circuit, said voltage generator responsive to operation of said tuning means to apply voltage to said lock-out circuit, and said lock-out circuit responsive to application of voltage from said generator to isolate electrically said load control circuit from said servo amplifier.

7. In a power amplifier stage having an input circuit, an output circuit, and servo means with control circuits, said control circuits including a bridge circuit having a series pair of diode rectifiers, said output circuit including impedance matching elements, said servo system operating in response to application of control voltage to said control circuits for adjusting said impedance matching elements, a voltage comparator circuit connected to said input circuit and to said output circuit for developing a control voltage that is a function of the ratio of the voltage on said output circuit to the voltage on said input circuit, said voltage comparator circuit being connected to said control circuits for applying control voltage thereto, adjustable elements for tuning the output circuit of said stage, a rate generator, means for simultaneously tuning the output circuit of said stage and for operating said rate generator, said comparator circuit being connected to the junction of said rectifiers of said control circuits, means for connecting said rate generator across said series rectifiers, and said rectifiers becoming non-conducting in response to the operation of said rate generator to isolate said comparator circuit from said servo system.

8. In a power amplifier stage having an input circuit, an output circuit, and servo means with control circuits; impedance matching elements in said output circuit, said servo system operating in response to application of control voltage to said control circuits for adjusting said impedance matching elements, a voltage comparator circuit connected to said input circuit and to said output circuit for developing a first control voltage that is a function of the ratio of the voltage on said output circuit to the voltage on said input circuit, a lock-out circuit, said voltage comparator circuit being connected through said lock-out circuit to said control circuits for applying said first control voltage thereto, adjustable reactive elements for tuning the output circuit of said stage, means for simultaneously tuning said output circuit and for developing a second control voltage for application to said lock-out circuit, said lock-out circuit operating in response to application of said second control voltage to isolate said comparator circuit from said servo system during tuning of said output circuit.

9. In a power amplifier stage having an input circuit and an output circuit, first and second adjustable reactive elements in said output circuit, tuning means operative for adjusting said first reactive element for tuning said output circuit to a desired frequency, servo means for tuning said second reactive element for determining the loading in said output circuit, control circuits including a voltage comparator circuit, a load current sensing circuit, and a lock-out circuit, said voltage comparator circuit being connected to said input and said output circuits for developing a control voltage which is a function of the ratio of the voltage on said output circuit to the voltage on said input circuit, said load current sensing circuit being coupled to said output circuit for developing control voltage proportional to the current flow in said output circuit, said voltage comparator circuit and said load current sensing circuit being connected through said lock-out circuit to said servo means, said servo means responsive to application of control voltage from said voltage comparator circuit and said load current sensing circuit for maintaining impedance of said output circuit constant regardless of the frequency and amplitude of signal in said output and said input circuits, a voltage generator coupled to said tuning means and electrically connected to said lock-out circuit, and said voltage generator operative in response to operation of said tuning means for disabling said lock-out circuit to isolate said voltage comparator circuit and said load current sensing circuit from said servo amplifier.

10. In a power amplifier stage having an input circuit, an output circuit, and servo means with control circuits; impedance matching elements in said output circuit, said servo system operating in response to application of control voltage to said control circuits for adjusting said impedance matching elements, a load current sensing circuit electrically coupled to said output circuit for developing a first control voltage proportional to the current flow in said output circuit, a lock-out circuit, said load current sensing circuit being connected through said lock-out circuit to said control circuits for applying said first control voltage thereto, adjustable reactive elements for tuning the output circuit of said stage, means for simultaneously tuning said output circuit and for developing a second control voltage for application to said lock-out circuit, said lock-out circuit operating in response to application of said second control voltage to isolate electrically said load current sensing circuit from said servo system during tuning of said output circuit.

11. In a power amplifier stage having an input circuit and an output circuit, said output circuit including first and second adjustable reactive elements, servo means for adjusting said second reactive elements, a lock-out bridge circuit, a fine-loading control circuit responsive to a change of loading in said output circuit for developing a control voltage, said fine-loading control circuit being connected through said lock-out bridge circuit to said servo means, said servo means responsive to application of control voltage from said fine-loading control circuit for positioning exactly said second reactive element, a coarse-loading control circuit connected to said servo means, said coarse-loading control circuit including first and second variable voltage control elements connected in a bridge arrangement, a voltage generator connected to said lock-out bridge circuit and to said coarse-loading control circuit, tuning means for simultaneously adjusting said first reactive elements, operating said voltage generator and varying said first voltage control element, said voltage generator operating to apply voltage to said lock-out bridge circuit and to said coarse-loading control circuit, said lock-out circuit operating in response to application of voltage from said voltage generator to isolate electrically said fine-loading control circuit from said servo means, said servo means operating in response to application of voltage to said coarse-loading control circuit to position said second reactive element and to vary said second variable voltage control element, said servo system operating to vary said second variable voltage control element until said bridge circuit arrangement is substantially balanced so that positioning of said second reactive element is a function of the positioning of said first reactive element, and said lock-out circuit electrically coupling said fine-loading control circuit to said servo means when said voltage generator is inoperative.

References Cited in the file of this patent

UNITED STATES PATENTS

| | | |
|---|---|---|
| 2,376,667 | Cunningham et al. | May 22, 1945 |
| 2,498,078 | Harrison | Feb. 21, 1950 |
| 2,498,340 | Morrison | Feb. 21, 1950 |
| 2,754,067 | True et al. | May 8, 1956 |